(12) United States Patent
Otsuki et al.

(10) Patent No.: US 9,159,676 B2
(45) Date of Patent: Oct. 13, 2015

(54) SEMICONDUCTOR MODULE

(71) Applicant: MITSUBISHI ELECTRIC CORPORATION, Tokyo (JP)

(72) Inventors: Takami Otsuki, Tokyo (JP); Rei Yoneyama, Tokyo (JP); Akihiko Yamashita, Hyogo (JP); Yoshitaka Kimura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/328,112

(22) Filed: Jul. 10, 2014

(65) Prior Publication Data

US 2015/0115478 A1  Apr. 30, 2015

(30) Foreign Application Priority Data

Oct. 31, 2013  (JP) .................................. 2013-226731

(51) Int. Cl.
*H01L 23/544* (2006.01)
*H01L 23/12* (2006.01)
*H01L 23/00* (2006.01)

(52) U.S. Cl.
CPC .............. *H01L 23/544* (2013.01); *H01L 23/12* (2013.01); *H01L 24/49* (2013.01); *H01L 2224/4912* (2013.01); *H01L 2924/3701* (2013.01)

(58) Field of Classification Search
CPC ....... H01L 23/544; H01L 24/49; H01L 23/12; H01L 2224/4912; H01L 2924/3701; H01L 2924/15153; H01L 2224/48145; H01L 21/486; H01L 23/5389; H01L 24/20; H01L 23/3121; H01L 23/49827; H01L 27/146
See application file for complete search history.

(56) References Cited

U.S. PATENT DOCUMENTS

2003/0085456 A1 *  5/2003  Lee et al. ....................... 257/686

FOREIGN PATENT DOCUMENTS

| JP | H01-281760 A | 11/1989 | |
| JP | 11186331 A * | 7/1999 | ............. H01L 21/60 |
| JP | 2000-031358 A | 1/2000 | |

* cited by examiner

*Primary Examiner* — Julio J Maldonado
*Assistant Examiner* — Farun Lu
(74) *Attorney, Agent, or Firm* — Studebaker & Brackett PC

(57) ABSTRACT

A power module includes: a base plate having a front surface provided with positioning wire bonding portions; an insulating substrate provided with hole portions accommodating the positioning wire bonding portions on a side of a back surface facing the base plate, and fixed to the base plate with being positioned with respect to the base plate by the hole portions accommodating the positioning wire bonding portions; and a semiconductor chip arranged on a side of a front surface of the insulating substrate opposite to the back surface.

10 Claims, 3 Drawing Sheets

SEMICONDUCTOR MODULE

BACKGROUND OF THE INVENTION

1. Field of the Invention

The present invention relates to a semiconductor module.

2. Description of the Background Art

In a power semiconductor module, an insulating substrate, a semiconductor chip, and the like are mounted on a metal base plate by solder joint. For example, Japanese Patent Laying-Open No. 2000-031358 and Japanese Patent Laying-Open No. 01-281760 propose techniques of providing, in a semiconductor module in which an insulating substrate having a circuit layout formed using copper foil is mounted on a metal base plate, convex and concave portions at predetermined positions on the metal base plate for positioning of the insulating substrate.

In the semiconductor modules proposed in Japanese Patent Laying-Open No. 2000-031358 and Japanese Patent Laying-Open No. 01-281760, it is necessary to perform additional processing on the base plate to provide the convex and concave portions in the base plate, which increases man-hours and reduces manufacturing efficiency. Further, in a case where the convex and concave portions are provided using a mold or the like, it is also necessary to change the design of the mold itself when the locations for forming the convex and concave portions and the number of the convex and concave portions are changed, and thus it is difficult to use the mold for the production of a wide variety of products in small quantities.

SUMMARY OF THE INVENTION

The present invention has been made in view of the aforementioned problem, and one object of the present invention is to provide a semiconductor module in which a reduction in manufacturing efficiency is suppressed and an insulating substrate is positioned with respect to a base plate with a high degree of accuracy.

A semiconductor module in accordance with the present invention includes: a base plate having a front surface provided with a positioning wire bonding portion; an insulating substrate provided with a receiving portion accommodating the positioning wire bonding portion on a side of a back surface facing the base plate, and fixed to the base plate with being positioned with respect to the base plate by the receiving portion accommodating the positioning wire bonding portion; and a semiconductor chip arranged on a side of a front surface of the insulating substrate opposite to the back surface.

According to the semiconductor module in accordance with the present invention, a semiconductor module in which a reduction in manufacturing efficiency is suppressed and an insulating substrate is positioned with respect to a base plate with a high degree of accuracy can be provided.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
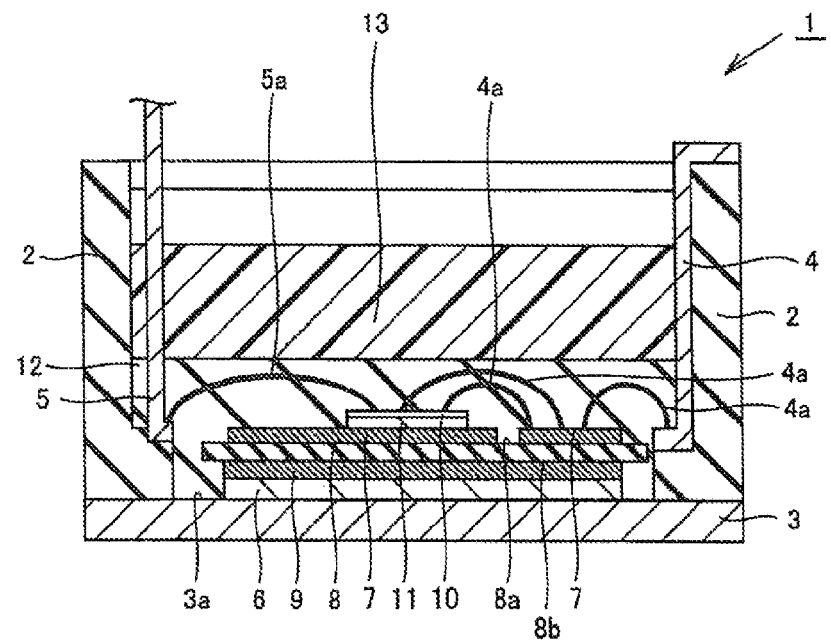
FIG. 1 is a schematic cross sectional view showing a structure of a semiconductor module in accordance with Embodiment 1.

Hereinafter, embodiments of the present invention will be described with reference to the drawings. In the drawings below, identical or corresponding parts will be designated by the same reference numerals, and the description thereof will not be repeated.

Embodiment 1

First, Embodiment 1 as one embodiment of the present invention will be described. To begin with, a structure of a semiconductor module in accordance with the present embodiment will be described. Referring to FIG. 1, a power module 1 as the semiconductor module in accordance with the present embodiment mainly includes a case 2, a base plate 3, a power terminal 4, a signal terminal 5, power wires 4a and a signal wire 5a (bonding wires), an insulating substrate 8, a semiconductor chip 10, a silicon gel 12, and a sealing resin 13.

Case 2 is arranged on a front surface 3a of base plate 3, and constitutes an internal space for accommodating semiconductor chip 10, together with base plate 3. Power terminal 4 is made of a metal, and extends while bending along an inner surface of case 2 to come close to semiconductor chip 10. Power terminal 4 is connected to a patterned layer 7 formed on a front surface 8a of insulating substrate 8 via power wire 4a.

Signal terminal 5 is made of a metal, and extends along the inner surface of case 2 to come close to semiconductor chip 10. Signal terminal 5 is arranged to face power terminal 4 and sandwich semiconductor chip 10 between itself and power terminal 4 in the internal space of case 2. Signal terminal 5 is connected to semiconductor chip 10 via signal wire 5a.

Insulating substrate 8 has front surface 8a and a back surface 8b, and patterned layers 7, 9 are formed on front surface 8a and back surface 8b, respectively. Patterned layers 7, 9 are made of, for example, copper foil or the like, and have a thickness of more than or equal to 0.1 mm and less than or equal to 0.5 mm Insulating substrate 8 is fixed to base plate 3 by a solder layer 6, with being positioned with respect to base plate 3. Solder layer 6 has a thickness of, for example, more than or equal to 0.1 mm and less than or equal to 0.5 mm. A mechanism for positioning insulating substrate 8 with respect to base plate 3 will be described later.

Semiconductor chip 10 is arranged on a side of front surface 8a of insulating substrate 8, and fixed to insulating substrate 8 by a solder layer 11. Semiconductor chip 10 is a semiconductor device such as, for example, a MOSFET (Metal Oxide Semiconductor Field Effect Transistor), an IGBT (Insulated Gate Bipolar Transistor), a diode, or the like. Although only one semiconductor chip 10 is fixed on insulating substrate 8 in FIG. 1, a plurality of the semiconductor devices described above may be placed next to each other and fixed on insulating substrate 8.

Silicon gel 12 is charged into the internal space of case 2 and covers semiconductor chip 10. Sealing resin 13 is arranged on silicon gel 12. Thus, semiconductor chip 10 is sealed with silicon gel 12 and sealing resin 13 in the internal space of case 2.

Figure 2:
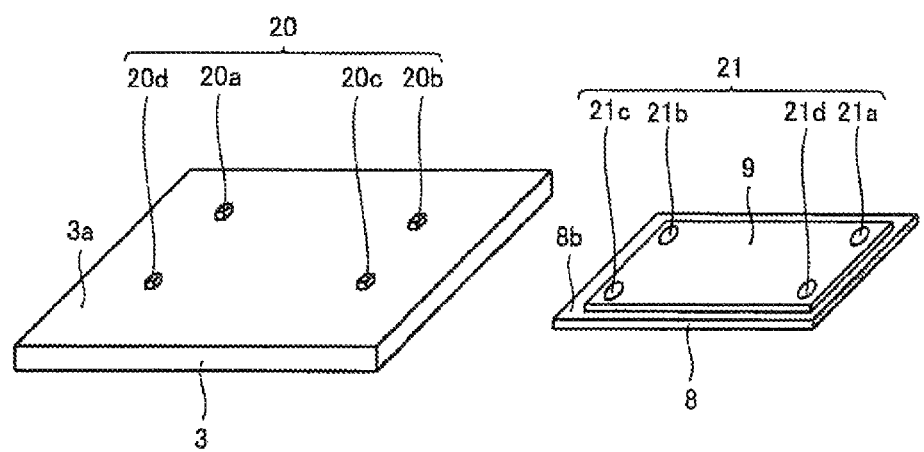
FIG. 2 is a schematic perspective view for illustrating the structure of the semiconductor module in accordance with Embodiment 1.

Next, the mechanism for positioning insulating substrate 8 with respect to base plate 3 will be described with reference to FIGS. 1 and 2. FIG. 2 shows a state where base plate 3 and insulating substrate 8 are exploded in power module 1 (FIG. 1). Referring to FIG. 2, a plurality of positioning wire bonding portions 20 (20a to 20d) are provided on front surface 3a of base plate 3. Positioning wire bonding portions 20 are fixed on base plate 3 by the same method as the method for fixing power wires 4a, signal wire 5a (FIG. 1), and like to semiconductor chip 10 and the terminals. More specifically, positioning wire bonding portions 20 are provided on front surface 3a by applying heat, ultrasound, pressure, or the like to wires placed on front surface 3a of base plate 3.

Positioning wire bonding portions 20 are made of a metal as with power wires 4a and signal wire 5a, and are made of a metal material such as, for example, aluminum, copper, or the like. Positioning wire bonding portions 20 each have a diameter of, for example, more than or equal to 0.1 mm and less than or equal to 1.0 mm. Although positioning wire bonding portions 20 may be arranged at four corners of a quadrangle, respectively, as shown in FIG. 2, the number thereof and the method for arranging them are not particularly limited.

A plurality of hole portions 21a to 21d (receiving portions) for accommodating positioning wire bonding portions 20a to 20d, respectively, are provided in patterned layer 9 formed on back surface 8b (surface facing base plate 3) of insulating substrate 8. More specifically, positioning wire bonding portions 20a to 20d can be inserted into hole portions 21a to 21d, respectively, and thereby insulating substrate 8 is positioned with respect to base plate 3.

Although hole portions 21 may be provided at corner portions (four corners) of a rectangle forming an outer peripheral shape of patterned layer 9 as shown in FIG. 2, positions of hole portions 21 are not limited thereto, and may be selected as appropriate depending on the number of positioning wire bonding portions 20 and the method for arranging them. For example, hole portions 21 may be provided at portions adjacent to the sides of the rectangle.

Power module 1 described above can be manufactured as described below. Referring to FIG. 1, first, insulating substrate 8 having patterned layers 7, 9 formed thereon and semiconductor chip 10 are fixed on front surface 3a of base plate 3 by soldering. Next, semiconductor chip 10 and patterned layer 7 are connected to power terminal 4, signal terminal 5, and the like, via power wires 4a and signal wire 5a. Subsequently, silicon gel 12 and sealing resin 13 are charged sequentially to seal semiconductor chip 10. Thereby, power module 1 described above is obtained.

Next, the features of power module 1 in accordance with the present embodiment will be described, and the function and effect thereof will also be described. Power module 1 includes: base plate 3 having front surface 3a provided with positioning wire bonding portion 20; insulating substrate 8 provided with hole portion 21 (receiving portion) accommodating positioning wire bonding portion 20 on a side of back surface 8b facing base plate 3, and fixed to base plate 3 with being positioned with respect to base plate 3 by hole portion 21 accommodating positioning wire bonding portion 20; and semiconductor chip 10 arranged on a side of front surface 8a of insulating substrate 8 opposite to back surface 8b.

In power module 1 described above, insulating substrate 8 can be fixed to base plate 3 with being positioned with respect to base plate 3 by positioning wire bonding portion 20 being accommodated in hole portion 21. This further simplifies the steps and improves manufacturing efficiency when compared with a case where the base plate itself is processed to form convex and concave portions or the like, and the convex and concave portions are used for positioning of insulating substrate 8. Further, positioning wire bonding portion 20 can be fabricated using the same facility as that used to connect power wires 4a and signal wire 5a, and the anchored position and the type of the wire can be easily changed for each kind. Furthermore, since formation of a resist for positioning of the insulating substrate on the base plate can be omitted, the base plate can be standardized.

In power module 1 described above, a plurality of positioning wire bonding portions 20a to 20d are provided on front surface 3a of base plate 3. In addition, a plurality of hole portions 21a to 21d (receiving portions) for accommodating the plurality of positioning wire bonding portions 20a to 20d, respectively, are provided on the side of back surface 8b of insulating substrate 8. Thereby, insulating substrate 8 can be positioned with respect to base plate 3 with a higher degree of accuracy.

In power module 1 described above, hole portion 21 (receiving portion) is provided in patterned layer 9 formed on back surface 8b of insulating substrate 8. Insulating substrate 8 is positioned with respect to base plate 3 by positioning wire bonding portion 20 being inserted into hole portion 21. Thereby, insulating substrate 8 can be positioned with respect to base plate 3 with a further higher degree of accuracy.

First Variation

Figure 3:
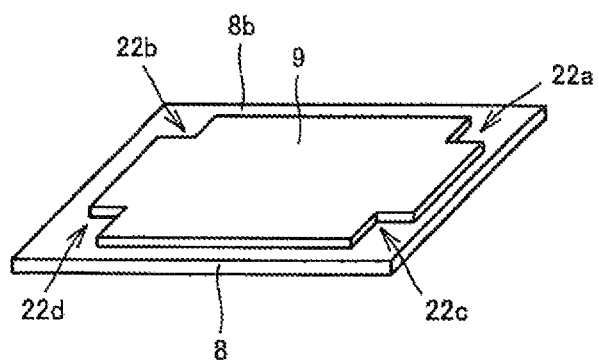
FIG. 3 is a schematic perspective view for illustrating a structure of a first variation of the semiconductor module in accordance with Embodiment 1.

Next, a first variation of power module 1 in accordance with the present embodiment will be described. FIG. 3 shows a structure of insulating substrate 8 and patterned layer 9 in the present variation. Referring to FIG. 3, in the present variation, a plurality of cutout portions 22 (22a to 22d) (receiving portions) are formed at end portions of patterned layer 9 formed on back surface 8b of insulating substrate 8. More specifically, patterned layer 9 has an outer peripheral shape in the form of a rectangle, and cutout portions 22a to 22d are formed at four corner portions of the rectangle, respectively. Insulating substrate 8 is configured to be positioned with respect to base plate 3 by positioning wire bonding portions 20a to 20d (FIG. 2) being located at cutout portions 22a to 22d, respectively. Thereby, patterned layer 9 is processed more easily, and thus productivity can be more improved.

Second Variation

Figure 4:
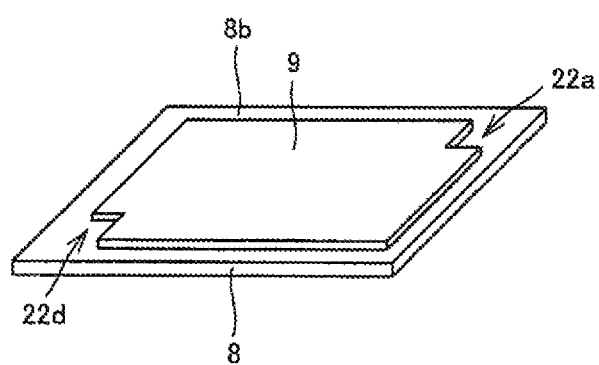
FIG. 4 is a schematic perspective view for illustrating a structure of a second variation of the semiconductor module in accordance with Embodiment 1.

Next, a second variation of power module 1 in accordance with the present embodiment will be described. FIG. 4 shows a structure of insulating substrate 8 and patterned layer 9 in the present variation. Referring to FIG. 4, in the present variation, cutout portions 22a, 22d, which are portions formed by cutting out two opposite corner portions of the rectangle forming the outer peripheral shape of patterned layer 9, are formed. Insulating substrate 8 is configured to be positioned with respect to base plate 3 by positioning wire bonding portions 20a, 20d (FIG. 2) being located at cutout portions 22a, 22d, respectively. Thereby, the shape of patterned layer 9 is more simplified, and productivity is further improved. In addition, by forming cutout portions 22a, 22d at two opposite corner portions (two corner portions farthest from each other) of the rectangle, the accuracy of positioning insulating substrate 8 with respect to base plate 3 can be more improved.

Third Variation

Figure 5:
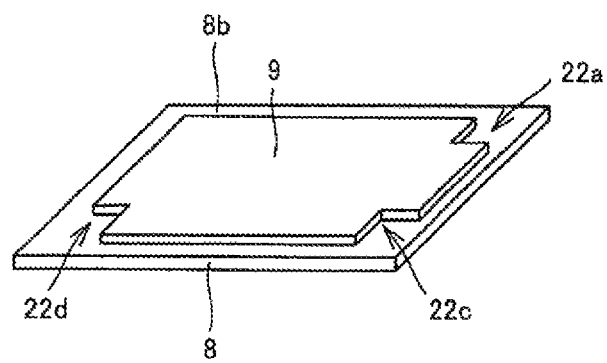
FIG. 5 is a schematic perspective view for illustrating a structure of a third variation of the semiconductor module in accordance with Embodiment 1.

Next, a third variation of power module 1 in accordance with the present embodiment will be described. FIG. 5 shows a structure of insulating substrate 8 and patterned layer 9 in the present variation. Referring to FIG. 5, in the present variation, in addition to cutout portions 22a, 22d formed by cutting out two opposite corner portions of the rectangle forming the outer peripheral shape of patterned layer 9, a cutout portion 22c, which is a portion formed by cutting out one corner portion different from the two corner portions, is further formed. Insulating substrate 8 is configured to be positioned with respect to base plate 3 by positioning wire bonding portions 20a, 20c, 20d (FIG. 2) being located at cutout portions 22a, 22c, 22d, respectively. Thereby, insulating substrate 8 is suppressed from being inclined with respect to base plate 3, and the accuracy of positioning insulating substrate 8 with respect to base plate 3 is further improved.

Fourth Variation

Figure 6:
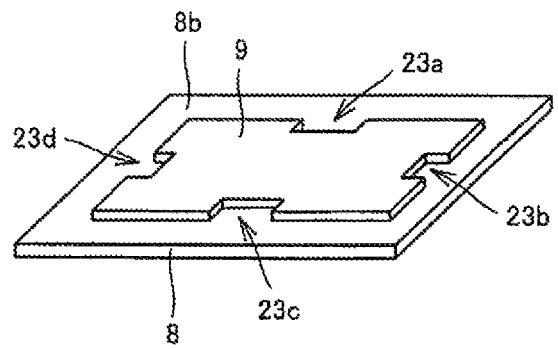
FIG. 6 is a schematic perspective view for illustrating a structure of a fourth variation of the semiconductor module in accordance with Embodiment 1.

Next, a fourth variation of power module 1 in accordance with the present embodiment will be described. FIG. 6 shows a structure of insulating substrate 8 and patterned layer 9 in the present variation. Referring to FIG. 6, in the present variation, cutout portions 23a to 23d, which are portions formed by cutting out the sides of the rectangle forming the outer peripheral shape of patterned layer 9, are formed. Insulating substrate 8 is configured to be positioned with respect to base plate 3 by positioning wire bonding portions 20 being located at cutout portions 23a to 23d, respectively. Thereby, two or more bonding locations can be provided in each of positioning wire bonding portions 20 respectively located at cutout portions 23a to 23d. As a result, locations where the wire shape is not changed by bonding can be provided, and a distance corresponding to the wire diameter can be ensured more reliably between base plate 3 and insulating substrate 8.

Embodiment 2

Next, Embodiment 2 as another embodiment of the present invention will be described. Basically, a semiconductor module in accordance with the present embodiment has the same configuration and exhibits the same effect as those of the semiconductor module in accordance with Embodiment 1. However, the semiconductor module in accordance with the present embodiment is different from the semiconductor module in accordance with Embodiment 1 in further including a control circuit for driving the semiconductor chip.

Figure 7:
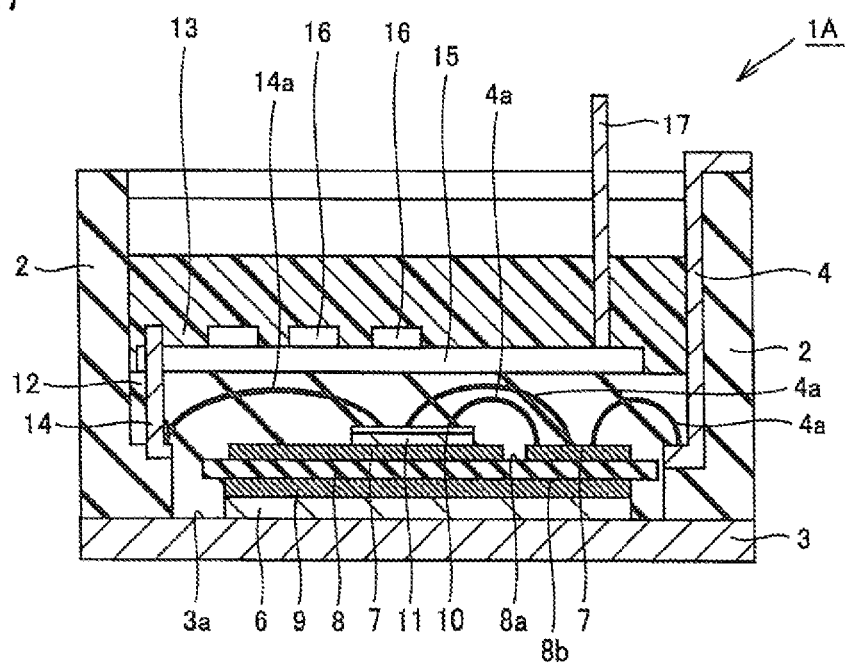
FIG. 7 is a schematic cross sectional view showing a structure of a semiconductor module in accordance with Embodiment 2.

Referring to FIG. 7, a power module 1A as the semiconductor module in accordance with the present embodiment further includes a control circuit composed of a relay terminal 14, a printed substrate 15, a plurality of SMT (Surface Mount Technology) components 16, and an interface 17, in addition to the configuration of power module 1 in accordance with Embodiment 1 (FIG. 1). This control circuit can drive semiconductor chip 10.

Relay terminal 14 extends to come close to semiconductor chip 10, and is connected to semiconductor chip 10 by a control wire 14a. Printed substrate 15 is arranged on silicon gel 12, and the plurality of SMT components 16 are arranged to be placed next to each other on a front surface of printed substrate 15. Interface 17 has one end portion connected to printed substrate 15, and the other end portion extending to the outside of case 2. Thus, power module 1A in accordance with the present embodiment is an intelligent power module (IPM) including the control circuit for driving semiconductor chip 10.

The semiconductor module in accordance with the present invention is applicable particularly advantageously to a semiconductor module required to suppress a reduction in manufacturing efficiency and position an insulating substrate with respect to a base plate with a high degree of accuracy.

Although the embodiments of the present invention have been described, it should be understood that the embodiments disclosed herein are illustrative and non-restrictive in every respect. The scope of the present invention is defined by the scope of the claims, and is intended to include any modifications within the scope and meaning equivalent to the scope of the claims.

What is claimed is:

1. A semiconductor module, comprising:
a base plate having a front surface provided with a positioning wire bonding portion;
an insulating substrate provided with a receiving portion accommodating said positioning wire bonding portion on a side of a back surface facing said base plate, and fixed to said base plate with being positioned with respect to said base plate by said receiving portion accommodating said positioning wire bonding portion; and
a semiconductor chip arranged on a side of a front surface of said insulating substrate opposite to said back surface; wherein
said receiving portion is a hole portion provided in a patterned layer formed on said back surface of said insulating substrate, and
said insulating substrate is positioned with respect to said base plate by said positioning wire bonding portion being inserted into said hole portion.

2. The semiconductor module according to claim 1, wherein
a plurality of said positioning wire bonding portions are provided on said front surface of said base plate, and
a plurality of said receiving portions accommodating the plurality of said positioning wire bonding portions, respectively, are provided on the side of said back surface of said insulating substrate.

3. The semiconductor module according to claim 1, wherein said hole portion is provided at a corner portion of a rectangle forming an outer peripheral shape of said patterned layer or at a portion adjacent to a side of said rectangle.

4. The semiconductor module according to claim 1, further comprising a control circuit for driving said semiconductor chip.

5. A semiconductor module, comprising:
a base plate having a front surface provided with a positioning wire bonding portion;
an insulating substrate provided with a receiving portion accommodating said positioning wire bonding portion on a side of a back surface facing said base plate, and fixed to said base plate with being positioned with respect to said base plate by said receiving portion accommodating said positioning wire bonding portion; and a semiconductor chip arranged on a side of a front surface of said insulating substrate opposite to said back surface; wherein said receiving portion is a cutout portion provided at an end portion of a patterned layer formed on said back surface of said insulating substrate, and said insulating substrate is positioned with respect to said base plate by said positioning wire bonding portion being located at said cutout portion.

6. The semiconductor module according to claim 5, wherein said cutout portion includes a portion formed by cutting out each of two opposite corner portions of a rectangle forming an outer peripheral shape of said patterned layer.

7. The semiconductor module according to claim 6, wherein said cutout portion further includes a portion formed by cutting out one corner portion different from said two corner portions.

8. The semiconductor module according to claim 5, wherein said cutout portion further includes a portion formed by cutting out a side of a rectangle forming an outer peripheral shape of said patterned layer.

9. The semiconductor module according to claim 5, wherein
  a plurality of said positioning wire bonding portions are provided on said front surface of said base plate, and
  a plurality of said receiving portions accommodating the plurality of said positioning wire bonding portions, respectively, are provided on the side of said back surface of said insulating substrate.

10. The semiconductor module according to claim 5, further comprising a control circuit for driving said semiconductor chip.

* * * * *